United States Patent [19]

Eichen

[11] Patent Number: 5,025,487

[45] Date of Patent: Jun. 18, 1991

[54] SYSTEM FOR TRANSMITTING INFORMATION ON INTERFEROMETRICALLY GENERATED OPTICAL CARRIERS

[75] Inventor: Elliot G. Eichen, Arlington, Mass.

[73] Assignee: GTE Laboratories Incorporated, Waltham, Mass.

[21] Appl. No.: 203,661

[22] Filed: Jun. 7, 1988

Related U.S. Application Data

[63] Continuation-in-part of Ser. No. 4,504, Jan. 20, 1987, Pat. No. 4,749,277.

[51] Int. Cl.$^5$ ............................................ H04B 10/04
[52] U.S. Cl. ...................................... 455/618; 455/610
[58] Field of Search ................ 455/618, 609, 612, 617, 455/610, 611, 619

[56] References Cited

U.S. PATENT DOCUMENTS

| | | | |
|---|---|---|---|
| Re. 31,969 | 8/1985 | Sell .......................................... | 372/38 |
| 3,420,600 | 1/1969 | Mevers et al. ......................... | 350/150 |
| 3,517,332 | 6/1970 | De Maria ............................... | 331/94.5 |
| 4,408,354 | 10/1983 | Culshaw et al. ...................... | 455/610 |
| 4,427,895 | 1/1984 | Eng ........................................ | 455/610 |
| 4,451,916 | 5/1984 | Casper et al. ......................... | 455/601 |
| 4,528,669 | 7/1985 | Bostick et al. ........................ | 372/26 |
| 4,530,097 | 7/1985 | Stokes et al. ......................... | 372/94 |
| 4,554,510 | 11/1985 | Shaw et al. ........................... | 330/4.3 |
| 4,561,119 | 12/1985 | Epworth ................................ | 455/609 |
| 4,579,417 | 4/1986 | Ih ........................................... | 350/96.11 |
| 4,616,898 | 10/1986 | Hicks, Jr. .............................. | 350/96.15 |
| 4,631,498 | 12/1986 | Cutler ................................... | 331/9 |
| 4,639,924 | 1/1987 | Tsunekawa ............................ | 372/33 |
| 4,660,206 | 4/1987 | Halmos et al. ........................ | 372/28 |
| 4,666,295 | 5/1987 | Duvall, III et al. .................... | 356/5 |
| 4,732,482 | 3/1988 | Rippel ................................... | 356/346 |
| 4,749,277 | 6/1988 | Eichen et al. ......................... | 356/349 |
| 4,759,080 | 7/1988 | Emura et al. ......................... | 455/608 |
| 4,817,192 | 3/1989 | Phillips ................................. | 455/200 |

OTHER PUBLICATIONS

Eichen, *Appl. Phys. Lett.* 51; pp. 398–400 (Aug. 10, 1987); "Interferometric Generation of High Power, Microwave Frequency, Optical Harmonics".

Eichen et al.; *J. Lightwave Technology LT-5*; pp. 1377–1381 (Oct. 1987); vol. LT-5; No. 10.

Eichen, "Generating of High Power Optical Signals for 10–100 GHz Optical Transmission", Proceedings, 12th Intl. Conf. on IR and MM Waves, No. 87CH2490-1, Dec. 14-18 1987.

Taylor, U.S. Statutory Invention Registration, Reg. No. H96 Published 8-5-86.

*Primary Examiner*—Joseph A. Orsino
*Assistant Examiner*—L. Van Beek
*Attorney, Agent, or Firm*—James J. Cannon, Jr.; Victor F. Lohmann, III

[57] ABSTRACT

A method of generating high power optical signals in the 1–100 GHz frequency range uses a frequency modulated semiconductor laser and an interferometer. This method is especially useful for microwave carrier frequency optical communications, distribution of microwave frequency local oscillator signals, and the generation of sinusoidal optical modulation at frequencies that cannot be reached by direct modulation in semiconductor lasers or with external module lasers.

5 Claims, 3 Drawing Sheets

SYSTEM FOR TRANSMITTING INFORMATION ON INTERFEROMETRICALLY GENERATED OPTICAL CARRIERS

CROSS-REFERENCE TO RELATED APPLICATIONS

This application is a continuation-in-part of U.S. Pat. No. 4,749,277, Ser. No. 07/004,504, filed Jan. 20, 1987 by Elliot G. Eichen and Andrew Silletti and issued on June 7, 1988.

BACKGROUND OF THE INVENTION

1. Field of the Invention

This invention relates to methods of generating optical signals, and, in particular, to methods of efficient generation of microwave frequency (greater than 10 GHz) optical signals using semiconductor lasers for use in optical communication systems, signal processing, radar systems, and RF component testing. Accordingly, it is a general object of this invention to provide new and improved methods of such character.

2. General Background

It is desired to develop optical communications systems and optical modulation methods that will operate in mm wave (greater than 10 GHz) frequency range using semiconductor lasers. The advantages of using optical fibers rather than metal waveguides for distributing microwave signals is well known. For example, optical fibers offer the advantages of low cost, low attenuation, reduced size and weight, and freedom from electromagnetic interference.

While optical detectors with bandwidths $\gtrsim 100$ GHz have been fabricated, directly modulated semiconductor lasers or waveguide modulators are limited to frequencies $\lesssim 25$ GHz. For example, high speed InGaAs detectors with bandwidths of 60 GHz have been reported by J. E. Bowers, C. A. Burrus and F. Mitschke, Electron. Lett. 22, 633 (1986). High speed GaAs detectors with bandwidths of 100 GHz have been reported by S. Y. Wang and D. M. Bloom, Electron. Lett. 19, pp. 554-555. The highest small signal bandwidth achieved at room temperature for a directly modulated semiconductor laser or external cavity traveling wave modulator is 22 GHz (R. Olshansky et al., Electronics Letters 23 pp. 839-841 (1987)) and 25 GHz, according to S. K. Korotky, G. Eisenstein, R. S. Tucker, J. J. Veselka, and G. Raybon, Paper FB4, Topical Meeting on Picosecond Electronics and Optoelectronics, Lake Tahoe, Nev. (1987). It appears that much improvement in semiconductor laser or integrated optic technology is required before devices can be developed with sufficient bandwidth and high power for modulation at the higher frequencies, such as at 35, 44, 60, and 90 GHz, which are of interest for many microwave and military applications (i.e., satellite communications, phased array radar, etc.).

SUMMARY OF THE INVENTION

The invention provides a method of interferometric generation of high power microwave optical harmonics (IGMOH) by using small signal modulation of a semiconductor laser. The electric field of a semiconductor laser whose bias current is sinusoidally modulated at frequency $\Omega$ contains harmonics at multiples of $\Omega$ (i.e., at $\Omega$, $2\Omega$, $3\Omega$, etc.). When the light from such a laser is detected without use of an interferometer prior to detection, the electric current from the detector contains power at $\Omega$ only. An unequal path interferometer changes the phase relationship between these harmonics so that they interfere constructively. Thus the interferometer converts harmonics of the electric field into intensity modulation; the photocurrent from an optical detector placed after an interferometer contains power at harmonics of the modulation frequency of the bias current. By correctly choosing the amplitude of the sinusoidal modulation (the modulation depth) and the optical path difference between arms of the interferometer, there can be efficient generation of optical power in a given harmonic of $\Omega$. In fact, this technique can be more efficient than direct modulation, depending upon amplitude of the modulating current.

Each harmonic of can be considered a carrier frequency. If the frequency of the sinusoidal modulation current is itself modulated, then each carrier will be frequency modulated, providing a method for transmitting information on a carrier frequency which is much higher than the actual electrically generated carrier.

In accordance with one aspect of the invention, a method of generating optical signals includes the steps of a) providing a source of laser light; b) coupling the output of the laser light to an input of a two beam fiber interferometer; c) coupling one of the outputs of the interferometer to a photodiode by way of a suitable optical medium; d) coupling another of the outputs of the interferometer to a monitor photodiode for providing path length stabilization therefrom; e) providing a dc bias control, sensitive to the path length stabilization, for producing a dc bias therefrom; f) providing an electrical carrier, providing modulation of the electrical carrier; and g) adding the carrier modulation to the dc bias and applying its summation to control the source of laser light, thereby maintaining the interferometer in adjustment.

In accordance with certain features of the invention, the applied signal can be a frequency modulated (analog) signal; it can be a frequency shift keyed (digital) signal; it can be an amplitude modulated signal (analog); it can be an amplitude shift keyed signal (digital). The medium can include optical fiber, and the medium can include air.

In accordance with another aspect of the invention, a method of generating optical signals includes the steps of a) modulating the sinusoidal electrical source; b) providing a direct current bias; c) adding the signals and the direct current bias to produce a summation; d) applying the summation to a laser diode that provides light at an optical frequency $\nu_0$, the laser diode having an output; and e) passing the output of the laser diode through an interferometer to a transmission optical fiber line.

In accordance with still another aspect of the invention, a method of generating optical signals includes the steps of a) switching microwave signals between frequencies $f_1$ and $f_2$, to and fro in accordance with a serial binary data source; b) providing a direct current bias; c) adding the signals and the direct current bias to produce a summation; d) applying the summation to a laser diode; e) passing the output of the laser diode through an interferometer to a transmission optical fiber line.

In accordance with certain features of the invention, the method further includes the steps of a) passing the output of the optical fiber line through a high frequency detector and bandpass filter to provide a filtered response therefrom; b) passing the filtered response through a limiter; and c) coupling a delay line discriminator to the limiter to provide digital data representative of the data source.

In accordance with yet another aspect of the invention, a method of generating optical signals includes the steps of a) applying binary data to a voltage controlled oscillator to cause it to vary between two frequencies, $f_1$ and $f_2$, in accordance with the data; b) providing a direct current bias; c) adding the varied frequencies, $f_1$ and $f_2$, to the direct current bias to produce a summation; d) applying the summation to a laser diode; e) passing the output of the laser diode through an interferometer to an optical fiber; f) detecting the laser light with an optical detector; and g) demodulating the information with a suitable frequency discriminator.

BRIEF DESCRIPTION OF THE DRAWINGS

Other objects advantages and features of this invention, together with its mode of operation, will become more apparent from the following description, when read in conjunction with the accompanying drawing, in which.

DESCRIPTION OF PREFERRED EMBODIMENTS

This specification sets forth a new method of interferometric generation of high power microwave optical harmonics (IGMOH) through the use of small signal modulation of a semiconductor laser.

Figure 1:
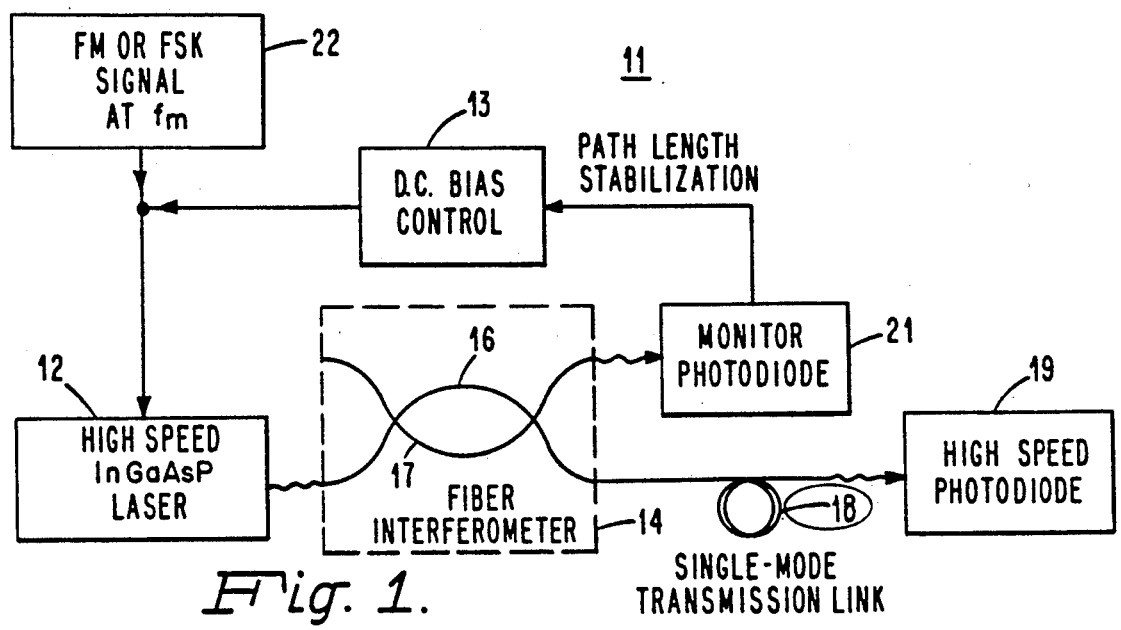
FIG. 1 is a diagram of a system implementation of interferometer generation of high power, microwave optical harmonics in accordance with one aspect of the invention.

A diagram of a practical system implementation 11 of IGMOH is depicted in FIG. 1.

Figure 2A:
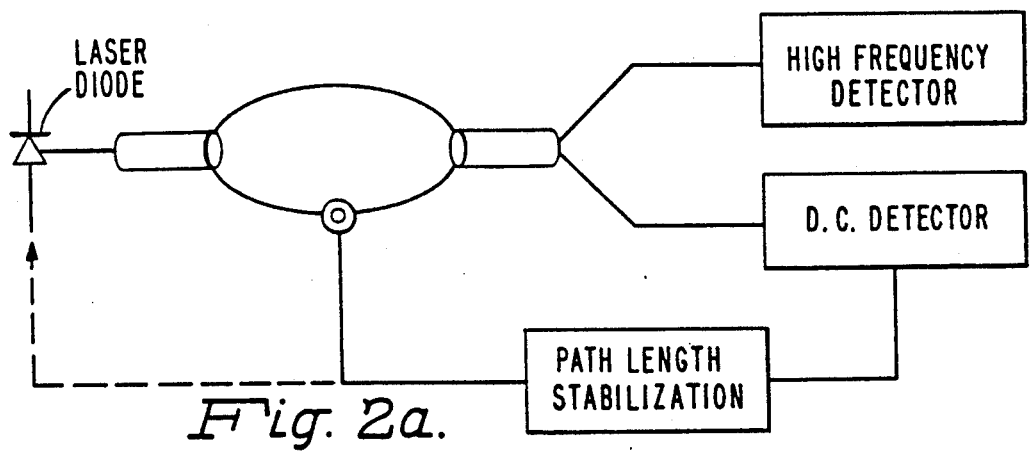
FIGS. 2a and 2b illustrate other interferometric apparatus suitable for practicing a method of the interferometric generation of high power optical wave harmonics in accordance with other aspects of the invention.
Figure 2B:
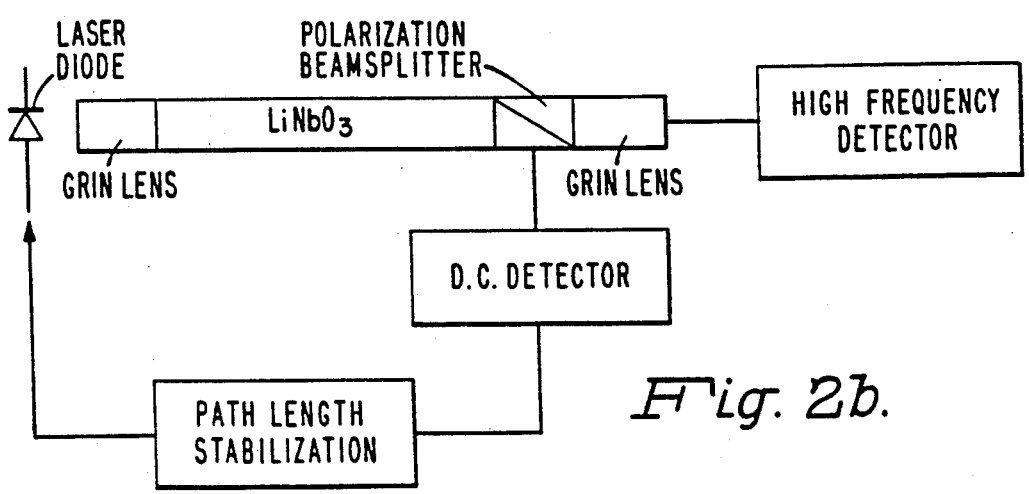

Details of two different interferometric designs are shown in FIGS. 2a and 2b as examples. Items common with the embodiment depicted in FIG. 1 will be readily apparent.

Referring to FIG. 1, a semiconductor laser 12 is dc biased by a suitable means 13 and is modulated at a frequency $f_m$ with an amplitude modulation index m. The output of the diode laser 12 is coupled to an interferometer 14 constructed of fiber couplers 16, 17. The output from one arm of the interferometer 14 is transmitted through a length of single-mode fiber 18, and is detected with a photodiode 19. The output of the other arm is used as a control signal to adjust the dc bias of the laser 12 to maintain the interferometer 14 in adjustment. This is achieved by coupling that other arm to a monitor photodiode 21 whose output provides path length stabilization to the dc bias control 13.

Both a dc bias from the dc bias control 13 and an FM or FSK signal at $f_m$ (from source 22) are added together and applied to correct the output of the semiconductor laser 12.

FM represents frequency modulation. FSK represents frequency shift keying, where binary data, representing 0's and 1's, can be represented by sequences of frequencies $f_1$ and $f_2$.

In lieu of this particular path length stabilization, the output of the monitor photodiode can be coupled directly to the interferometer (not through dc bias control) so as to control the optical path difference between the arms of the fiber interferometer. The other output of the fiber interferometer 14 is directed through a single-mode transmission link 18 to a photodiode 19 either through the continuation link 18, or via free space, or by way of a multimode fiber.

This invention was tested utilizing a laser that was modulated at 9 GHz, wherein a harmonic signal was generated at 18 GHz that had microwave power equal to that of a 9 GHz directly modulated signal. The maximum microwave frequency of 18 GHz was limited only by the 20 GHz bandwidth of an available InGaAs PIN detector. The invention was noted to have the following attractive features:

1—High power can be generated at a specified harmonic. For example, when a laser is directly modulated at 20 GHz, high power signals can be generated at 40 and 60 GHz. An 8 mW signal at 40 or 60 GHz can be generated with a laser biased at only 10 mW.

2—The laser relative intensity noise (RIN), as discussed hereinafter, is extremely low as a result of noise cancellation produced by the interferometer.

3—There are a number of interferometric configurations (such as a compact micro-optic Michelson interferometer, or a Mach-Zender fiber interferometer formed by two biconic fiber couplers) which are compact and rugged. The interferometer is easily maintained in adjustment by using a control circuit to make slight adjustments to the laser dc bias.

Laser relative intensity noise (RIN) can be understood as fluctuations in intensity (or photon number) due to quantum fluctuations in drive current, even for a D.C. biased (only) device. The optical noise so produced is termed "relative intensity noise".

The technique and theory of interferometric generation of high-power microwave harmonics are described in a paper by the inventor hereof entitled, "Interferometric Generation of High-Power Microwave Frequency Optical Harmonics" Applied Physics Letters 51(6), Aug. 10, 1987 pp. 398–400 which is incorporated by reference herein.

A short summary of various ideas presented in the foregoing article is set forth below.

When a laser is amplitude modulated, strong modulation of the optical frequency also occurs due to the strong coupling between the photons and the injected carriers in the laser cavity. The strong frequency modulation of the laser's output produces signals at all harmonics of the modulating current of frequency $f_m$. If no interferometer is used, all the harmonics maintain their phase relationship and add constructively to provide the original amplitude modulated signal at $f_m$.

The interferometer alters the phase relationships among the harmonics, and permits the selection of either even or odd harmonics by adjusting the path difference of the interferometer. When even harmonics only are selected, the output of the interferometer is proportional to a sum of terms, $$I(t) = \Sigma J_{2k}(2\beta) \cos(2k\omega_m t)$$

where $\beta$ is the FM modulation depth of the laser and $J_{2k}$ is the 2kth order Bessel function. The power in the kth harmonic, which represents the microwave signal at frequency $k\omega_m$, can be maximized by choosing the modulation index $\beta$ which maximizes the kth Bessel function.

The efficiency of this conversion process is illustrated by the following example. Assume that the laser is biased at 10 mW and is modulated at 20 GHz. To maximize the signal at 40 GHz, the modulation index $\beta$ of 1.55 is chosen to maximize $J_2(2\beta)$. For the laser the amplitude modulation index should be m=0.31. The directly modulated optical signal has an amplitude $mE_o^2$ or $0.31E_o^2$. The signal at 40 GHz has an amplitude $J_2(2\beta)\cdot E_o^2$ or $0.5E_o^2$. The signal at 40 GHz is actually 50% larger than the directly modulated signal at 20 GHz.

The modulation depths and the microwave output powers expected for the first five harmonics are tabulated below, when $\beta$ is tuned to maximize each in turn.

| Frequency | $\beta$ | m | Amplitude of IGMOH Signal |
|---|---|---|---|
| 20 GHz | 0.95 | 0.19 | 5.8 mW |
| 40 GHz | 1.55 | 0.31 | 4.9 mW |
| 60 GHz | 2.10 | 0.42 | 4.3 mW |
| 80 GHz | 2.70 | 0.54 | 4.0 mW |
| 100 GHz | 3.20 | 0.64 | 3.7 mW |

The foregoing table sets forth a tabulation wherein the IGMOH optical signal is tabulated for the first five harmonics of a laser biased at 10 mW and modulated at 20 mW.

The experiments reported in the Applied Physics Letters Article prepared by the inventor hereof have directly verified that the amplitudes of the first and second harmonics are in agreement with this analysis.

The specification has described interferometric generation of optical harmonics; however, other specific methods for using the concept of this invention as part of an overall optical communication system is set forth below.

Figure 3:
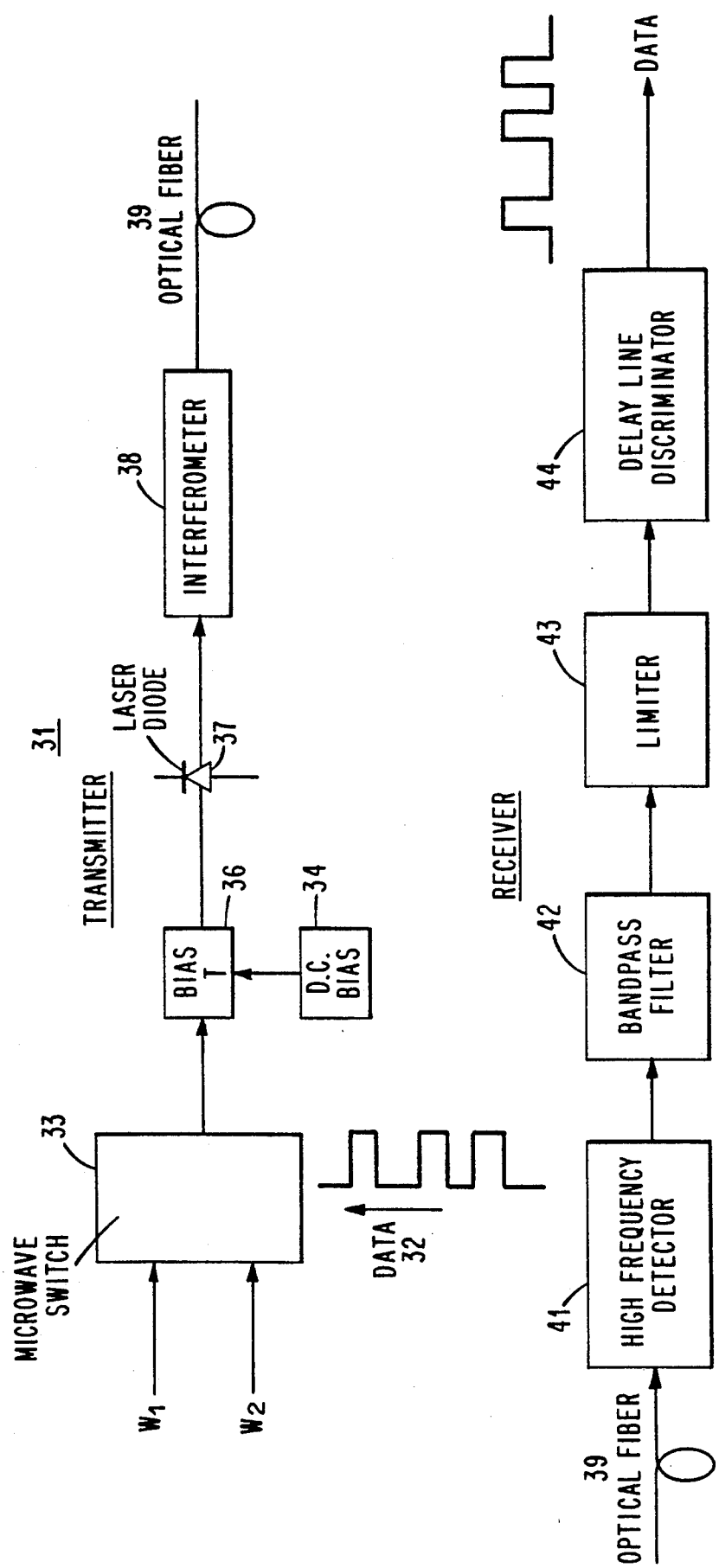
FIG. 3 is a block diagram of an optical communications system including an optical transmitter (in accordance with still another aspect of the invention) and an optical receiver.

One example of a digital, frequency shift keyed (FSK) system 31 is illustrated in FIG. 3. Binary data 32 is coupled to control a microwave switch 33 to select one of two tones $f_1$ or $f_2$ which is then used as an RF input for IGMOH. That is, the output of the microwave switch and the output of the dc bias 34 are coupled to a bias T 36 which sums the output of the switch 33 and the dc bias 34 and presents it to control a diode laser 37 which is coupled to an interferometer 38 that is coupled to the output optical fiber 39. The modulation strength of the signal depends on which harmonic (i.e. which carrier frequency) is required. The demodulation of the FSK signal is similar to other FM receivers. For example, as indicated in FIG. 3, the optical fiber 39 is coupled to a high frequency detector 41 which is coupled via a bandpass filter 42 to a limiter 43 whose output is coupled through a delay line discriminator 44 to present electrical data therefrom.

Figure 4:
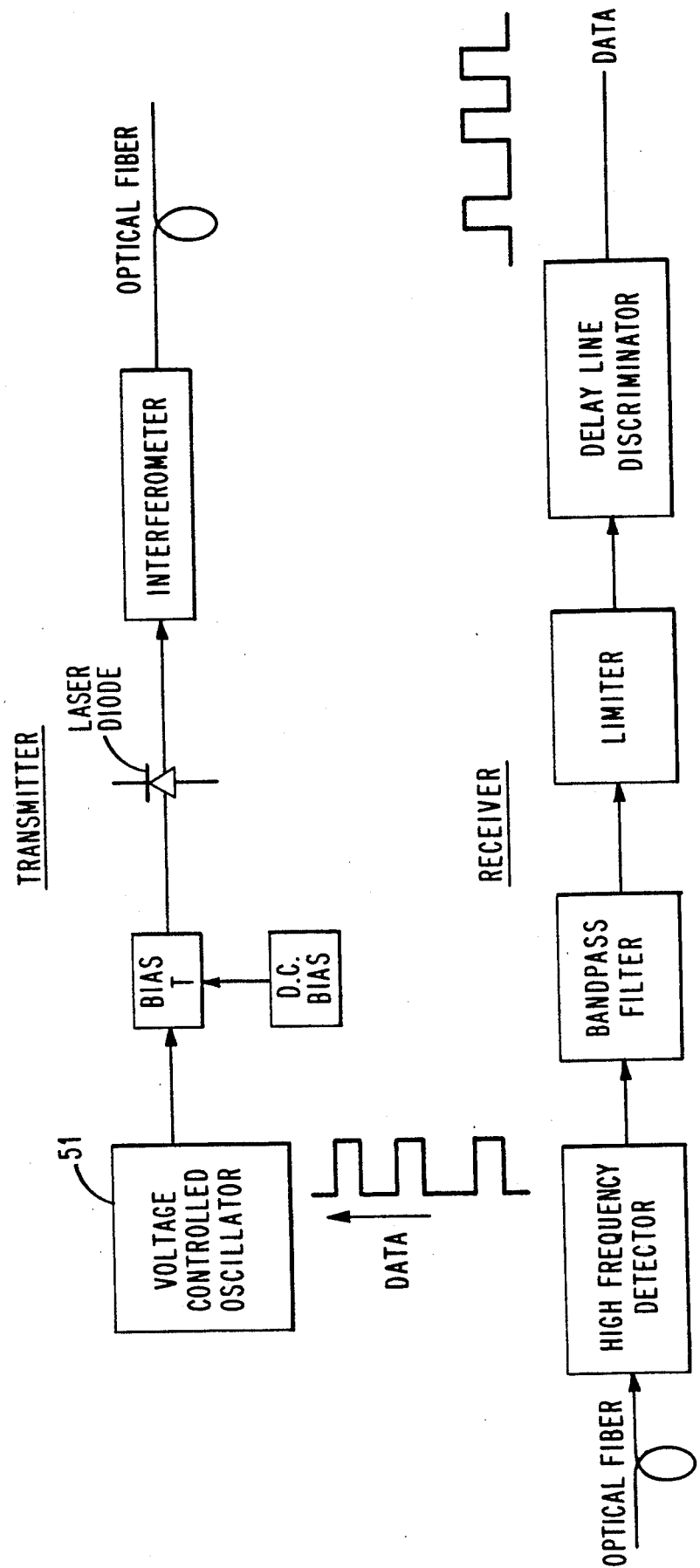
FIG. 4 is a block diagram showing an optical system with an optical transmitter (at still yet another aspect of the invention) together with an optical receiver.

Another example of analog FM modulation using a voltage controlled oscillator 51 (VCO) as a source is depicted in FIG. 4. An example of this technique has also been implemented in which the bias current of a laser was modulated with a carrier frequency of 5.4 GHz. The carrier frequency was modulated with a 25 MHz square wave. The receiver blocked out the 5.4 GHz fundamental carrier and recovered the signal from the first harmonic carrier (10.7 GHz). Another modulation technique would include amplitude shift keying provided that the combination of modulation depth and position on the interferometer's transfer yield a sufficiently linear signal, or that compensation is provided.

Various modifications will suggest themselves to those skilled in the art without departing from the spirit and scope of this invention.

What is claimed is:

1. An optical transmitter, comprising:
   means for generating a sinusoidal drive signal;
   means for modulating said drive signal with an information signal;
   a semiconductor laser;
   means for applying said modulated drive signal and a DC bias signal to said laser for modulating said laser, wherein the modulated output spectrum from said laser has both frequency modulated components and amplitude modulated components;
   interferometric means for splitting said laser output signal into two separate light beams which subsequently travel over respective path lengths having an optical path difference therebetween before being combined into an output signal; and
   means for adjusting said optical path difference to a selected value such that the output signal from said interferometric means is due solely to frequency modulated components at either even harmonics or odd harmonics of said modulated drive signal in accordance with said selected path difference, said harmonics being at frequencies which are much greater than the bandwidth of said laser.

2. The optical transmitter as recited in claim 1 wherein said means for generating a drive signal further including:
   a microwave switch for selecting one of two tones in response to an input digital signal.

3. The optical transmitter as recited in claim 1 wherein said means for generating a drive signal further including:
   a voltage controlled oscillator responsive to an input digital information signal for providing said drive signal.

4. A method of upconverting a baseband information signal to a high frequency carrier in an optical transmission system, comprising the steps of:
   modulating a drive signal with said information signal;
   applying said modulated drive signal and a DC bias signal to a semiconductor laser for modulating said laser, thereby providing a laser output signal having both frequency modulated and amplitude modulated components;
   applying said laser output signal to an interferometer for splitting said laser signal into two beams that traverse separate pathways having an optical path difference therebetween before said beams are combined into an output signal; and
   adjusting said optical path difference to a selected value such that the output signal from said interferometer is due solely to frequency modulated components at either even or odd harmonics of said modulated drive signal in accordance with said selected path difference, said harmonics being at frequencies which are much greater than the modulation bandwidth of said laser.

5. An optical communication system, comprising:
means for generating a sinusoidal drive signal;
means for modulating said drive signal with an information signal;
a semiconductor laser;
means for applying said modulated drive signal and a DC bias signal to said laser for modulating said laser, wherein the modulated output spectrum from said laser has both frequency modulated components and amplitude modulated components;
interferometric means for splitting said laser output signal into two separate light beams which subsequently travel over respective path lengths having an optical path difference therebetween before being combined into an output signal;
means for adjusting said optical path difference to a selected value such that the output signal from said interferometric means is due solely to frequency modulated components at either even harmonics or odd harmonics of said modulated drive signal in accordance with said selected path difference, said harmonics being at frequencies which are much greater than the bandwidth of said laser;
optical transport means coupled at one end to said interferometric means for receiving said optical harmonic spectrum;
an optical detector coupled to the other end of said optical transport means wherein said harmonic spectrum is delivered to said detector for generating a photocurrent;
a bandpass filter receiving said photocurrent and filtering out all but a selected harmonic from said harmonic spectrum;
a limiter for removing spurious amplitude variations from aaid selected harmonic signal; and
a delay line discriminator coupled to said limiter from which said information signal is provided.

* * * * *